(12) United States Patent
Nakamura (10) Patent No.: US 10,149,386 B2
(45) Date of Patent: Dec. 4, 2018

(54) CIRCUIT ASSEMBLY

(71) Applicants: AutoNetworks Technologies, Ltd., Yokkaichi, Mie (JP); Sumitomo Wiring Systems, Ltd, Yokkaichi, Mie (JP); Sumitomo Electric Industries, Ltd., Osaka-shi, Osaka (JP)

(72) Inventor: Arinobu Nakamura, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/327,886

(22) PCT Filed: Jul. 1, 2015

(86) PCT No.: PCT/JP2015/069023
§ 371 (c)(1),
(2) Date: Jan. 20, 2017

(87) PCT Pub. No.: WO2016/013363
PCT Pub. Date: Jan. 28, 2016

(65) Prior Publication Data
US 2017/0208688 A1    Jul. 20, 2017

(30) Foreign Application Priority Data
Jul. 22, 2014  (JP) .................................. 2014-148722

(51) Int. Cl.
*H05K 1/18* (2006.01)
*H05K 1/02* (2006.01)
(Continued)

(52) U.S. Cl.
CPC ............. *H05K 1/18* (2013.01); *H05K 1/0204* (2013.01); *H05K 1/0209* (2013.01);
(Continued)

(58) Field of Classification Search
CPC ...... H05K 1/18; H05K 1/0204; H05K 3/4007; H05K 1/181; H05K 1/0209; H05K 1/111;
(Continued)

(56) References Cited

U.S. PATENT DOCUMENTS

2003/0137813 A1\* 7/2003 Onizuka .............. H05K 1/0263
361/777
2006/0092235 A1\* 5/2006 Sugahara ............. B41J 2/14233
347/65

FOREIGN PATENT DOCUMENTS

| JP | H07-336009 A | 12/1995 |
|---|---|---|
| JP | 2006-005096 A | 1/2006 |
| JP | 2006-158062 A | 6/2006 |

OTHER PUBLICATIONS https://www.engineeringtoolbox.com/thermal-conductivity-d_429.html.\*

(Continued)

*Primary Examiner* — Mandeep S Buttar
(74) *Attorney, Agent, or Firm* — Honigman Miller Schwartz and Cohn LLP (57) ABSTRACT

Provided is a circuit assembly that can suppress deterioration of its heat releasing capability caused by a pit formed by the formation of a protruding portion that enters an opening formed in a substrate. Provided is a manufacturing method with which such a circuit assembly can be produced easily. A conductive member is provided with a protruding portion that enters an opening formed in a substrate and to which a terminal of an electronic component is connected, a pit formed by formation of the protruding portion is covered by a base member for supporting the conductive member, and
(Continued)

an embedding member having a heat conductivity higher than that of air is provided inside the pit.

3 Claims, 5 Drawing Sheets (51) Int. Cl.
*H05K 3/40* (2006.01)
*H05K 3/20* (2006.01)

(52) U.S. Cl.
CPC ......... *H05K 1/0265* (2013.01); *H05K 3/4007* (2013.01); *H05K 1/181* (2013.01); *H05K 3/202* (2013.01); *H05K 2201/10416* (2013.01)

(58) Field of Classification Search
CPC .......... H05K 2201/10166; H05K 2201/10757; H05K 3/3421; Y02P 70/611; Y02P 70/613
USPC .................................. 361/719, 820; 174/50
See application file for complete search history.

(56) References Cited

OTHER PUBLICATIONS

English tranlsation of JP reference.*
International Search Report for PCT/JP2015/069023, dated Sep. 8, 2015, 4 pp.

* cited by examiner

CIRCUIT ASSEMBLY

CROSS-REFERENCE TO RELATED APPLICATIONS

This application is the U.S. national stage of PCT/JP2015/069023 filed Jul. 1, 2015, which claims priority of Japanese Patent Application No. JP 2014-148722 filed Jul. 22, 2014.

FIELD OF THE INVENTION

The present invention relates to a circuit assembly including a substrate and a conductive member.

BACKGROUND

Circuit assemblies are known in which a conductive member that is part of a circuit that allows a relatively large electric current to flow is fixed to a substrate on which a conductive pattern is formed that is part of a circuit that allows a relatively small electric current to flow (for example, see JP 2006-5086A).

In order to check whether the terminal of the electronic component and the conductive member are reliably connected, in the circuit assembly disclosed in JP 2006-5086A, the conductive member is provided with a protruding portion that enters an opening formed in the substrate, and the protruding portion is connected to the terminal. However, if such a protruding portion is formed, a pit is formed as well, and thus there has been a problem that air (an air layer) in the pit prevents heat generated in the electronic component from being released.

An issue resolved by the present invention is to provide a circuit assembly that includes a conductive member in which a protruding portion that enters an opening formed in a substrate is formed, and that can suppress deterioration of its heat releasing capability caused by a pit formed by the formation of the protruding portion. Also, provided is a manufacturing method with which such a circuit assembly can be produced easily.

SUMMARY OF INVENTION

In order to resolve the above-described issue, a circuit assembly according to the present invention includes a substrate provided with an opening and an electronic component mounted on one side of the substrate, and a conductive member that is a plate-shaped member fixed to the other side of the substrate, the conductive member constituting a conductive path. The conductive member is provided with a protruding portion, having a first leg opposite and spaced apart from a second leg, that enters the opening formed in the substrate and to which a terminal of the electronic component is connected, a pit formed by formation of the protruding portion is covered by a base member for supporting the conductive member, and an embedding member having a heat conductivity higher than a heat conductivity of air is provided inside the pit so as to be on a first and a second side by the first and second legs of the conductive member.

It is preferable that the embedding member is in intimate contact with an inner surface of the pit.

Also, in order to resolve the above-described issue, a method for manufacturing the circuit assembly according to the present invention includes a protruding portion formation step of fitting the embedding member to the inside of the pit simultaneously with the formation of the protruding portion by pressing, with a punch, a material that is to form the embedding member against a material that is placed on a die and is to form the conductive member.

In the circuit assembly according to the present invention, the embedding member having a heat conductivity higher than that of air, suppressing deterioration of its heat releasing capability caused by the formation of the pit is provided inside the pit formed by the protruding portion.

If the embedding member is in intimate contact with an inner surface of the pit, that is, no gap will form between the embedding member and the inner surface of the pit (conductive member) (no air layer forms between them), the capability of releasing heat through the embedding member will be further improved.

According to the method for manufacturing a circuit assembly according to the present invention, it is possible to fit the embedding member to the inside of the pit simultaneously with the formation of the protruding portion. According to the method, compared to a circuit assembly obtained through a step of fitting the embedding member to the inside of the pit after formation of the protruding portion, a gap is unlikely to form between the embedding member and the inner surface (conductive member) of the pit.

DETAILED DESCRIPTION OF THE PREFERRED EMBODIMENTS

Hereinafter, an embodiment of the present invention will be described in detail with reference to the drawings. Unless indicated otherwise, "surface direction" in the description below refers to a surface direction of a substrate 10 and a conductive member 20, and "height direction" (vertical direction) refers to a direction orthogonal to the surface direction (where a surface of the substrate 10 on which an electronic component 30 is mounted is the top surface).

Figure 1:
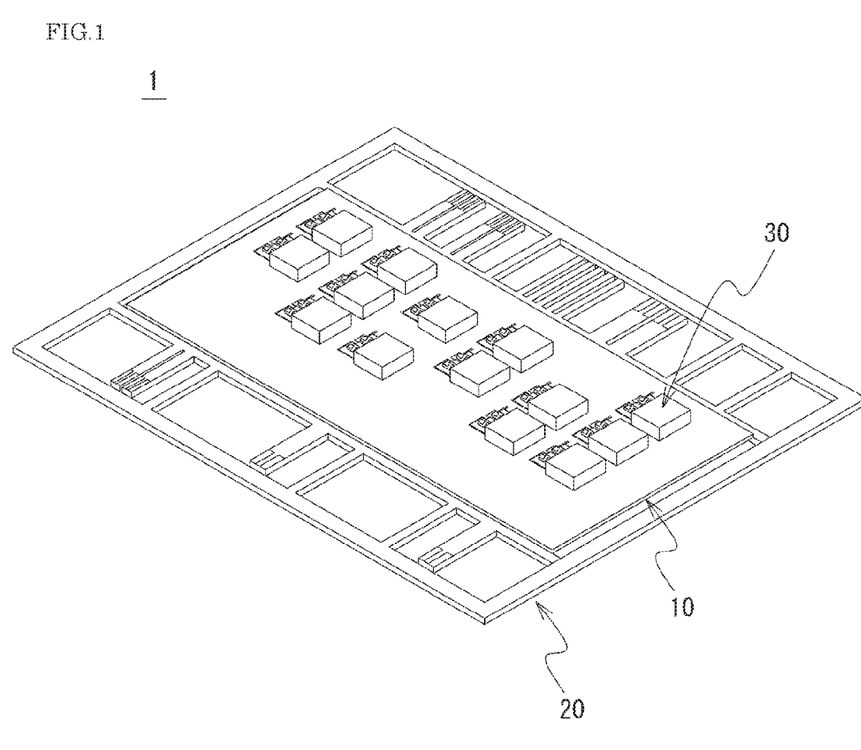
FIG. 1 is a diagram of an external appearance of a circuit assembly according to one embodiment of the present invention.

A circuit assembly 1 according to one embodiment of the present invention includes the substrate 10 and the conductive member 20. The substrate 10 is such that a conductive pattern (only a land 13, which is a portion of the conductive pattern and will be described later, is depicted) is formed on one side 10a (an upper surface side). A conductive path constituted by the conductive pattern is a conductive path (portion of the circuit) for control signals, through which an electric current flows that is smaller than the electric current through the conductive path (portion of the circuit) constituted by the conductive member 20.

The conductive member 20 is a plate-shaped portion fixed to another side 10b of the substrate 10. The conductive member 20 is formed into a predetermined shape by pressing or the like, and constitutes a conductive path for power, which is a portion through which a relatively large (larger than in the conductive path constituted by the conductive pattern) electric current flows. Note that description and illustration of a specific configuration of the conductive path are omitted. The conductive member 20 is also referred to as a "bus bar" (bus bar plate) or the like. The conductive member 20 is fixed to the other side 10b of the substrate 10 via an insulating adhesive sheet, for example, and the substrate 10 and the conductive member 20 are integrated into a single member (combination of the substrate 10 and the conductive member 20). Because the conductive path constituted by the conductive pattern or the conductive member 20 may have any shape, its description is omitted. Note that the outer frame of the conductive member 20 shown in FIG. 1 will be cut off eventually.

Figure 2:
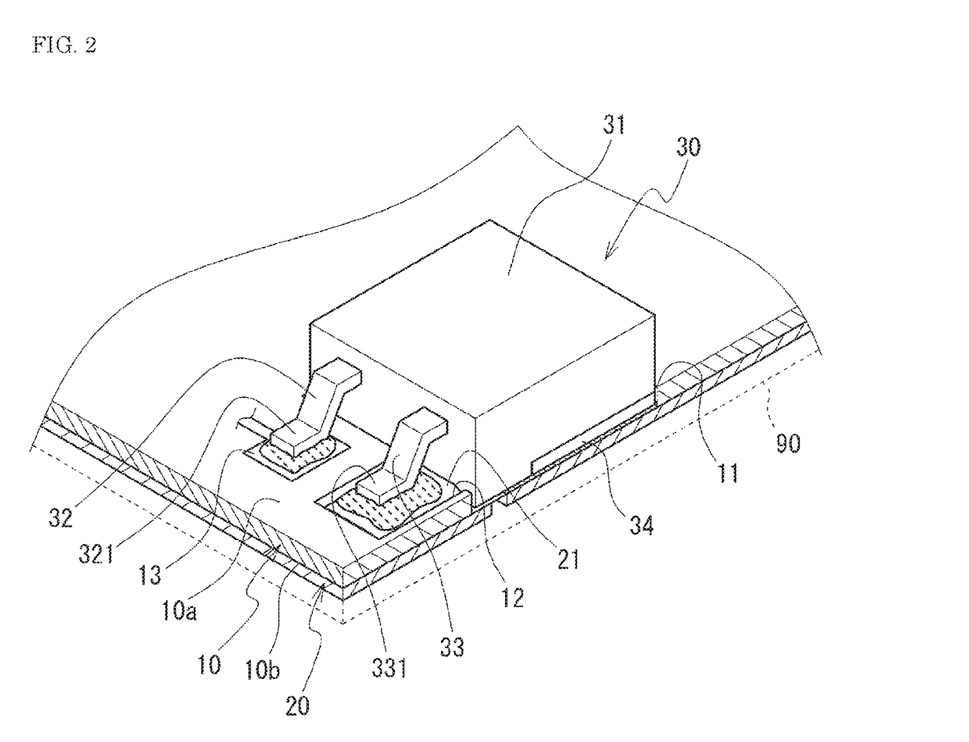
FIG. 2 is a diagram showing an enlarged region of the circuit assembly on which the electronic component is mounted.

The electronic components 30 mounted on the substrate 10 each have a main element body 31 and a terminal portion. The electronic components 30 of the present embodiment each have a first terminal 32, a second terminal 33 (corresponding to a terminal in the present invention), and a third terminal 34 serving as the terminal portions. An example of such an electronic component 30 is a transistor (FET). In this case, the first terminal 32 is a gate terminal, the second terminal 33 is a source terminal, and the third terminal 34 is a drain terminal. As described later, the first terminal 32 is connected to the conductive pattern of the substrate 10, the second terminal 33 is connected to the conductive member 20, and the third terminal 34 is connected to a site other than the site of the conductive member 20 to which the second terminal 33 is connected. In the following explanations, it is assumed that the electronic component 30 has various terminals, but it may have a plurality of a given type of terminals.

The first terminal 32 and the second terminal 33 protrude from a side surface of the main body 31, which has an approximately rectangular parallelepiped shape. Specifically, the two terminals have base end portions protruding along the surface direction, portions that bend downward from the front ends of the base end portions, and front end portions 321 and 331 extending from the front ends of the bent portions along the surface direction. The heights of the front end portions 321 and 331 (positions in the vertical direction) that are soldered are approximately the same. In the present embodiment, the first terminal 32 and the second terminal 33 are formed to have completely the same shape. That is, when viewed in the direction along the surface of the main body 31 that is provided with the terminals, the first terminal 32 and the second terminal 33 overlap with each other.

The third terminal 34 is a plate-shaped portion provided at the bottom (lower surface) of the main body 31. That is, the third terminal 34 extends in the surface direction. It can also be said that the third terminal 34 is a portion constituting at least a part of the bottom of the main body 31.

Figure 3A:
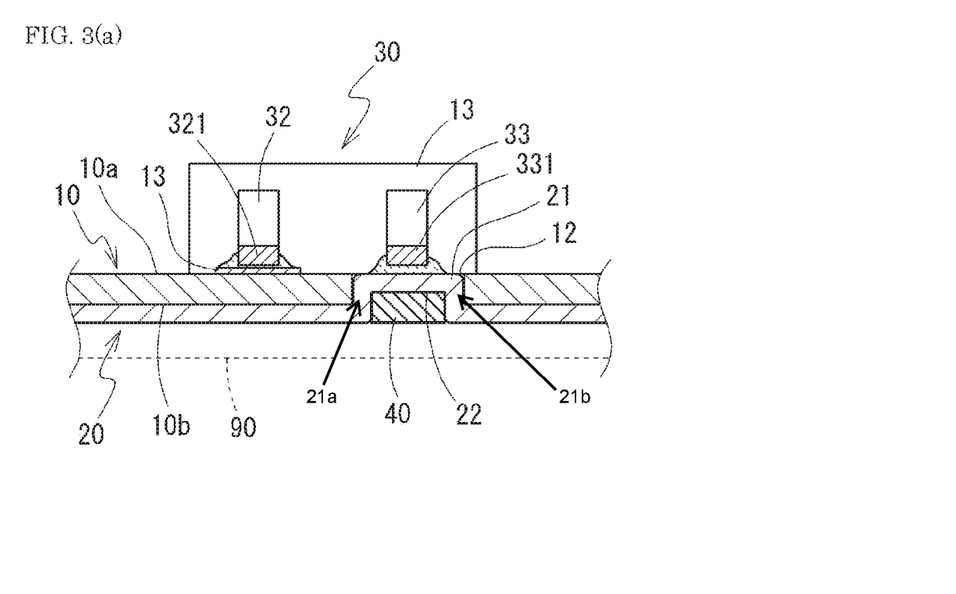
FIG. 3(a) is a diagram of the region cut with a plane passing through front end portions of a first terminal and a second terminal taken along a cross-sectional view of a portion (a substrate and a conductive member) of the region of the circuit assembly on which the electronic component is mounted.
Figure 3B:
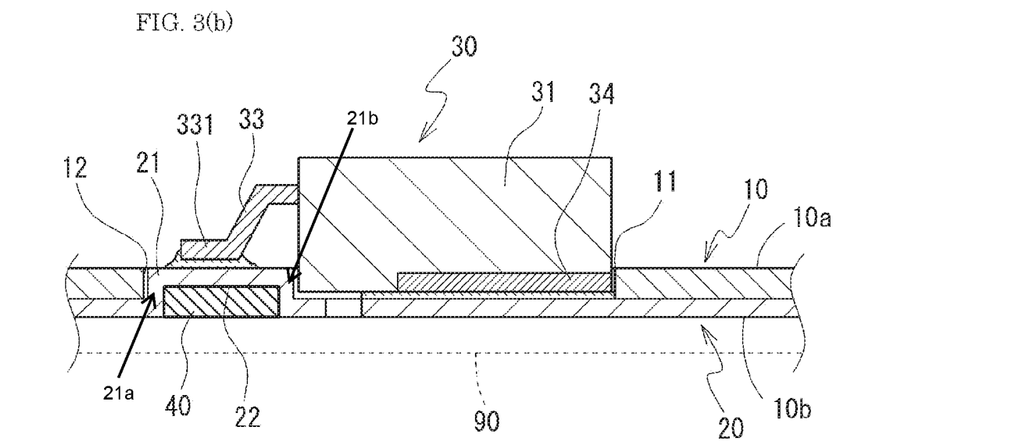
FIG. 3(b) is a cross-sectional view of the region cut with a plane extending along the second terminal taken along a cross-sectional view of a portion (a substrate and a conductive member) of the region of the circuit assembly on which the electronic component is mounted.

Such an electronic component 30 is mounted on the substrate 10 (combination of the substrate 10 and the conductive member 20) as follows. A first opening 11 that passes through the substrate 10 in its thickness direction is formed at a location of the substrate 10 on which the electronic component 30 is mounted. The first opening 11 has such a size that the main body 31 of the electronic component 30 can go through the first opening 11. The main body 31 of the electronic component 30 is soldered to the conductive member 20 through this first opening 11. Since the bottom of the main body 31 is provided with the third terminal 34, the third terminal 34 is electrically connected to a predetermined location (a portion facing the first opening 11) of the conductive member 20. Accordingly, the main body 31 is physically connected to the conductive member 20 (combination of the substrate 10 and the conductive member 20), and the third terminal 34 is electrically connected to the conductive member 20.

The front end portion 321 of the first terminal 32 of the electronic component 30 is located on a predetermined site of the conductive pattern in a state in which the electronic component 30 is placed at a predetermined position of the substrate 10. Specifically, the first terminal 32 is located on the land 13 (a portion of the conductive pattern) to which the first terminal 32 is to be connected. The first terminal 32 is soldered to this land 13. That is, the first terminal 32 is physically and electrically connected to the conductive pattern.

Also, a second opening 12 (corresponding to an opening in the present invention) passing through the substrate 10 in the thickness direction is formed in the substrate 10. The second opening 12 is formed at such a position that the front end portion 331 of the second terminal 33 overlaps with the second opening 12 in the vertical direction in a state in which the electronic component 30 is placed at a predetermined position of the substrate 10.

On the other hand, the conductive member 20 is provided with a protruding portion 21 that enters this second opening 12. The protruding portion 21 is a protrusion protruding upward (to the substrate 10 side) so as to define a first leg 21a and a second leg 21b, and is formed by bending a plate-shaped metal material constituting the conductive member 20 (for example, forming it approximately into a cross-sectional "U" shape). Thus, the formation of the protruding portion 21 forms a pit (depression) 22 on the conductive member 20 on the other side of the substrate 10.

The protruding portion 21 is exposed at the second opening 12 when viewed from the one side 10a of the substrate 10. The second terminal 33 of the electronic component 30 is soldered to this protruding portion 21. That is, the second terminal 33 is physically and electrically connected to the conductive member 20. The position (height) of a front end of the protruding portion 21 is set to be approximately the same as the position of the one side 10a of the substrate 10. Doing so makes it possible to connect the front end portion 331 to the protruding portion 21 without bending the second terminal 33.

The circuit assembly 1 having such a configuration is placed on a base member 90 made of a non-conductive material. Specifically, a surface of the conductive member 20 on the other side of the substrate 10 is fixed in intimate contact with the base member 90. Note that the base member 90 may have any configuration as long as it can be brought into intimate (areal) contact with the conductive member 20. For example, the base member 90 may be a portion constituting a wall surface of a case that accommodates the circuit assembly 1. In particular, in order to increase the adherence to the conductive member 20 and an embedding member 40 that will be described later, the base member 90 may be made of a viscoelastic material. Also, in order to increase its heat releasing capability, the base member 90 may be made of a highly heat conductive material.

Because the circuit assembly 1 is placed on such a base member 90, the pit 22 (an opening of the pit 22) formed by the formation of the protruding portion 21 is covered by the base member 90. In the present embodiment, the embedding member 40 is provided inside this pit 22 so as to be enclosed on a first and a second side by the first and second legs 21a, 21b of protruding portion 21 of the conductive member 20. The embedding member 40 is made of a material having at least a heat conductivity higher than that of air. An example of a preferable material is a metal material having a high heat conductivity, such as copper. Providing such an embedding member 40 further increases the efficiency of releasing heat generated in the electronic component 30 to the conductive member 20, compared to the case where no embedding member 40 is provided in the pit 22, that is, the case where only air is present.

In order to avoid a decrease in the efficiency of releasing heat via the embedding member 40, the embedding member 40 is preferably in intimate contact with the inner surface of the pit 22. This is because that if there is a gap (an air layer) between the outer surface of the embedding member 40 and the inner surface of the pit 22, then heat conduction from the conductive member 20 to the embedding member 40 is inhibited by this gap.

Figure 4A:
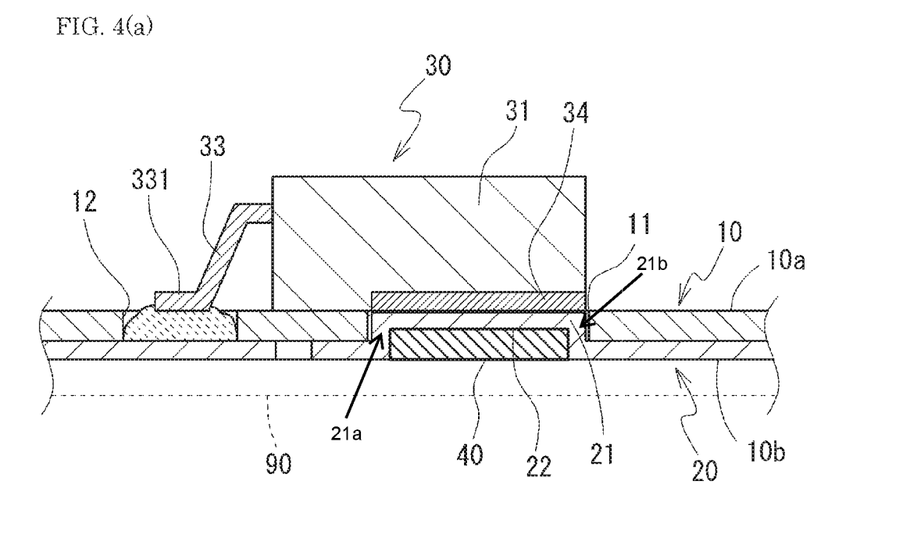
FIG. 4(a) is a diagram illustrating a variation of the circuit assembly according to this embodiment showing a single protruding portion.

A configuration as shown in FIG. 4(a) is conceivable as a variation of the circuit assembly 1 above. In this example, the conductive member 20 is provided with the protruding portion 21 as a site connected to the third terminal 34. That is, the conductive member 20 is provided with the protruding portion 21 that enters the first opening 11 formed in the substrate 10. Even if the protruding portion 21 is formed at such a position, the embedding member 40 may be provided inside the pit 22 formed by the formation of this protruding portion 21. Note that in the configuration shown in FIG. 4(a), the second terminal 33 is connected to the conductive member 20 by solder piled up in the second opening 12.

Figure 4B:
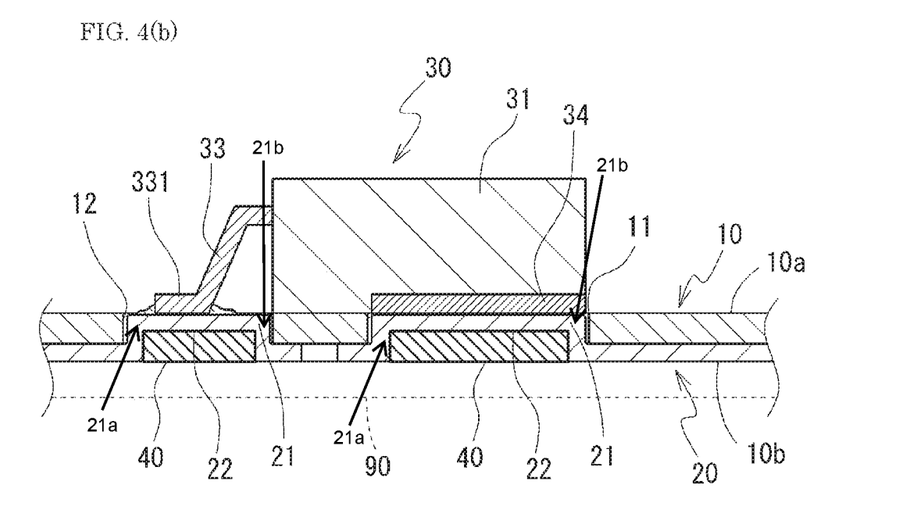
FIG. 4(b) is a diagram illustrating a variation of the circuit assembly according to this embodiment showing a pair of protruding portions.

Also, as shown in FIG. 4(b), a configuration is possible in which both the protruding portion 21 connected to the second terminal 33 and the protruding portion 21 connected to the third terminal 34 are provided.

That is, the protruding portion 21 may be a portion connected to any terminal of the electronic component 30, and the number of protruding portions 21 may be one or more. An embedding member 40 may be provided inside each of the pits 22 formed by the formation of the protruding portions 21. Note that as shown in FIG. 4(a) and FIG. 4(b), a structure in which the protruding portion 21 connected to the third terminal 34 is provided and the main body 31 of the electronic component 30 is placed on the substrate 10 is advantageous in that it is possible to use, without processing such as bending of a terminal, an electronic component 30 in which a lower surface of the main body 31 and lower surfaces of the front end portion 321 of the first terminal 32 and the front end portion 331 of the second terminal 33 are substantially flush with each other (in many electronic components 30, lower surfaces of the terminals are substantially flush with each other in this way).

Hereinafter, a suitable method for manufacturing the circuit assembly 1 (the conductive member 20 provided in the circuit assembly 1) according to the present embodiment (a method for manufacturing the circuit assembly 1 according to one embodiment of the present invention) will be described. The conductive member 20 is made of a conductive metal plate. First, a member (referred to as "pressed member 20a", hereinafter) in which a desired conductive path is constructed is obtained by pressing the metal plate. Thereafter, the embedding member 40 is fitted to the inside of the pit 22 simultaneously with the formation of the above-described protruding portion 21. The procedure (a protruding portion formation step) is as follows.

Figure 5A:
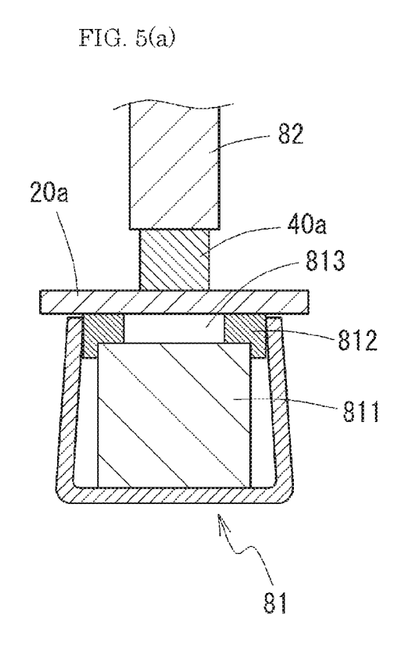
FIG. 5(a) is a diagram illustrating a suitable method for manufacturing a circuit assembly according to this embodiment wherein the pressed member is placed on a die with a recessed portion.

First, the pressed member 20a is placed on a die 81. The die 81 is provided with a recessed portion 813 corresponding to the shape of the protruding portion 21 that is to be formed. The recessed portion 813 is constituted by a die main body 811, and a movable portion 812 provided around the die main body 811. The movable portion 812 is biased toward its center.

Figure 5B:
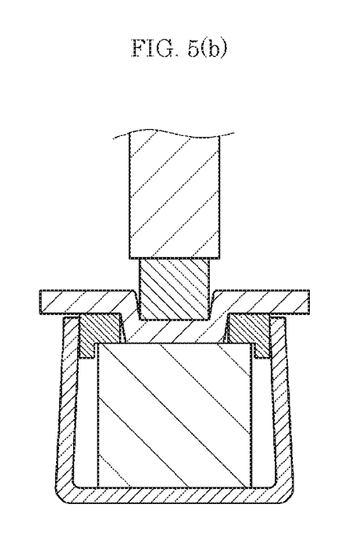
FIG. 5(b) is a diagram illustrating the material pressed against the pressed member.
Figure 5C:
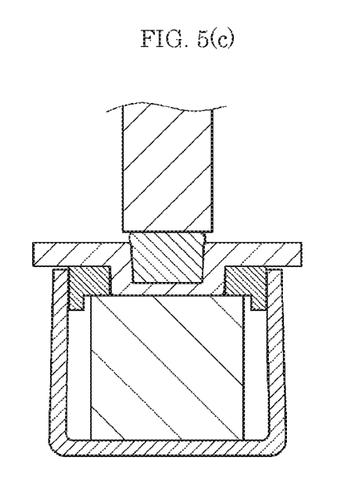
FIG. 5(c) is a diagram illustrating the movable portions biased towards the center of the die.
Figure 5D:
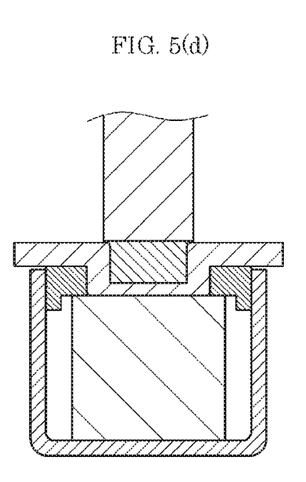
FIG. 5(d) is a diagram illustrating the movable portions biased away from the center of the die.

In that state, a material 40a that is to form the embedding member is placed on the pressed member 20a on the side opposite to the recessed portion 813, and the material 40a that is to form the embedding member is pressed against the pressed member 20a with a punch 82. Accordingly, the pressed member 20a deforms due to the applied pressure while becoming depressed, entering the recessed portion 813, and the material 40a that is to form the embedding member enters this pit 22. At this time, the pressed member 20a deforms while resisting a biasing force of the movable portion 812 that is biased toward its center. When the punch 82 is lowered and approaches the die 81, the embedding member 40 enters the pit 22 simultaneously with the formation of a portion corresponding to the protruding portion 21. That is, an assembly of the conductive member 20 and the embedding member 40 can be obtained. Moreover, since the protruding portion 21 is formed by pressing the material 40a that is to form the embedding member, it is possible to obtain an assembly of the conductive member 20 in which the embedding member 40 is in intimate contact with the inner surface of the pit 22 and the embedding member 40.

The subsequent manufacturing steps may be any suitable steps. For example, the above-described circuit assembly 1 may be obtained through a step of fixing the substrate 10 to the obtained assembly of the conductive member 20 and the embedding member 40, and a step of mounting the electronic component 30 on a predetermined site of the substrate 10.

In this manner, according to the method for manufacturing the above-described circuit assembly 1, the embedding member 40 can be fitted to the inside of the pit 22 simultaneously with the formation of the protruding portion 21. That is, compared to a method of fitting the embedding member 40 to the inside of the pit 22 after formation of the protruding portion 21, the steps can be simplified. Also, the embedding member 40 is in intimate contact with the inner surface of the pit 22. That is, compared to a circuit assembly obtained through a step of fitting the embedding member 40 to the inside of the pit 22 after formation of the protruding portion 21, a gap is unlikely to form between the embedding member 40 and the inner surface of the pit 22 (the conductive member 20).

Note that the step of constructing a desired conductive path and the step of fitting the embedding member 40 to the inside of the pit 22 simultaneously with the formation of the protruding portion 21 may also be performed simultaneously.

Although the embodiment of the present invention has been described in detail above, the present invention is not merely limited to the above-described embodiment, and it will be appreciated that various modifications can be made without departing from the gist of the present invention.

The invention claimed is:

1. A circuit assembly comprising:
   a substrate provided with an opening and an electronic component mounted on one side of the substrate; and
   a conductive member that is a plate-shaped member fixed to the other side of the substrate, the conductive member constituting a conductive path,
   wherein the conductive member includes a first leg spaced apart from a second leg and a protruding portion interconnecting a top portion of each of the first and second legs so as to have a U-shaped cross-section defining a pit, wherein the protruding portion enters the opening formed in the substrate and to which a terminal of the electronic component is connected,
   a base member for supporting the conductive member and covering a bottom opening of the pit; and
   an embedding member having a heat conductivity higher than a heat conductivity of air is provided inside the pit; the embedding member being enclosed on a first and a second side by the first and second legs of the conductive member.

2. The circuit assembly according to claim 1, wherein the embedding member is in intimate contact with an inner surface of the pit.

3. A method for manufacturing the circuit assembly according to claim 2, comprising:
   a protruding portion formation step of fitting the embedding member to the inside of the pit simultaneously with the formation of the protruding portion by pressing, with a punch, a material that is to form the embedding member against a material that is placed on a die and is to form the conductive member.

* * * * *